US008227983B2

(12) United States Patent  
Lee et al.

(10) Patent No.: US 8,227,983 B2  
(45) Date of Patent: Jul. 24, 2012

(54) ORGANIC LIGHT-EMITTING DIODE DISPLAY DEVICE AND METHOD OF FABRICATING THE SAME

(75) Inventors: Jong Hwa Lee, Seoul (KR); Joon Suk Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 954 days.

(21) Appl. No.: 11/821,141

(22) Filed: Jun. 22, 2007

(65) Prior Publication Data

US 2008/0001864 A1    Jan. 3, 2008

(30) Foreign Application Priority Data

Jun. 30, 2006 (KR) .................. 10-2006-0060254

(51) Int. Cl.
- *H01L 27/28* (2006.01)
- *H01J 9/00* (2006.01)
- *H01J 1/62* (2006.01)
- *H01L 27/32* (2006.01)

(52) U.S. Cl. ........... 313/512; 313/498; 313/504; 445/23

(58) Field of Classification Search .......... 313/498–512; 445/23–25

See application file for complete search history.

(56) References Cited

U.S. PATENT DOCUMENTS

| | | | | |
|---|---|---|---|---|
| 4,963,002 A | * | 10/1990 | Tagusa et al. | 349/149 |
| 2004/0227459 A1 | * | 11/2004 | Imura | 313/504 |
| 2005/0258429 A1 | * | 11/2005 | Cok et al. | 257/79 |
| 2006/0113903 A1 | * | 6/2006 | Kim | 313/506 |
| 2006/0119263 A1 | * | 6/2006 | Chen et al. | 313/512 |

* cited by examiner

*Primary Examiner* — Joseph L Williams  
*Assistant Examiner* — Nathaniel Lee  
(74) *Attorney, Agent, or Firm* — Brinks Hofer Gilson & Lione

(57) ABSTRACT

An OLED display device and a method of fabricating the same is disclosed, to realize the simplified process, wherein the OLED display device comprises a sub-pixel driving array disposed on a first substrate; an OLED array disposed on a second substrate; a sealant to bond the first and second substrates to each other; a plurality of lower pads disposed on the first substrate; a plurality of upper pads disposed on the second substrate; and a plurality of conductive balls included in the sealant, wherein the upper pads are respectively connected with the lower pads through the conductive balls.

16 Claims, 5 Drawing Sheets

ORGANIC LIGHT-EMITTING DIODE DISPLAY DEVICE AND METHOD OF FABRICATING THE SAME

This application claims the benefit of Korean Patent Application No. 2006-60254, filed on Jun. 30, 2006, which is hereby incorporated by reference as if fully set forth herein.

BACKGROUND OF THE INVENTION

1. Field of the Invention

The present invention relates to an organic light-emitting diode (OLED) display device, and more particularly, to an OLED display device and a method of fabricating the same, to realize the simplified process.

2. Discussion of the Related Art

Among various display devices which represent information as images, an organic light-emitting display device has attracted great attentions owing to its thin profile corresponding to paper. The organic light-emitting display device using a thin organic light-emitting layer formed between electrodes emits light by itself, which is referred to as an electro-luminescence display device or an organic light-emitting diode display device (hereinafter, which is referred to as an OLED display device). The OLED display device has the advantageous properties of lower power consumption, thinner profile and greater self-light emission as compared to those of a liquid crystal display device. In the meantime, the OLED display device has the disadvantageous properties of short lifespan.

The OLED display device is developing in an active matrix type which is suitable for displaying moving images by separately driving sub-pixels of red, green and blue colors included in one unit pixel. The active matrix OLED (AMOLED) display device includes a plurality of sub-pixels, wherein each of the sub-pixels is comprised of an organic light-emitting diode (OLED) including the cathode, the anode and an organic light-emitting layer formed between the cathode and the anode; and a sub-pixel driver to drive the OLED independently. Each sub-pixel driver includes at least two thin film transistors and a storage capacitor, wherein the sub-pixel driver controls the brightness of OLED based on a current amount supplied to the OLED. Also, the OLED includes a hole-injection layer, a hole-transport layer, a light-emitting layer, an electron-transport layer, and an electron-injection layer provided between the cathode and the anode and formed of an organic material. As a forward-directional voltage is applied between the cathode and the anode, electrons of the cathode are moved to the light-emitting layer through the electron-injection layer and the electron-transport layer. Also, holes of the anode are moved to the light-emitting layer through the hole-injection layer and the hole-transport layer. The light-emitting layer emits the light by recombination of the electrons supplied through the electron-transport layer and the holes supplied through the hole-transport layer. At this time, the brightness of emitted light is proportion to the current amount flowing between the cathode and the anode.

The related art AMOLED display device is formed in an encapsulation structure where a substrate including both a sub-pixel driving array and an OLED array is bonded to a packaging plate, wherein the light is emitted through the substrate including the sub-pixel driving array and the OLED array. The packaging plate includes a getter material which absorbs moisture and gas, to thereby prevent the organic light-emitting layer from being deteriorated. If defects occur in the process of OLED array after completing the process of sub-pixel driving array, the substrate is disused whereby the yield is lowered. Also, it is difficult to apply the packaging plate to a high-resolution display device since the packaging plate limits an aperture ratio.

In order to overcome these problems, there is a recent development for a dual-plate type AMOLED display device where sub-pixel driving array and OLED array are formed on different substrates. However, the dual-plate type AMOLED display device has the disadvantageous properties in that a lower substrate including the sub-pixel driving array requires more mask processes as compared with an upper substrate. Accordingly, there is a need to decrease the number of mask processes for the lower substrate, thereby lowering the fabrication cost.

SUMMARY OF THE INVENTION

Accordingly, the present invention is directed to an OLED display device and a method of fabricating the same that substantially obviates one or more problems due to limitations and disadvantages of the related art.

An object of the present invention is to provide an OLED display device and a method of fabricating the same, to realize the simplified process.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an OLED display device comprises a sub-pixel driving array formed on a first substrate; an OLED array formed on a second substrate; a sealant to bond the first and second substrates to each other; a plurality of lower pads formed on the first substrate; a plurality of upper pads formed on the second substrate; and a plurality of conductive balls included in the sealant, wherein the upper pads are respectively connected with the lower pads through the conductive balls. At this time, the plurality of conductive balls is formed of anisotropic conducting balls having the elastic properties. Also, the sealant overlaps with the plurality of upper pads and lower pads. The plurality of lower pads is completely covered by the sealant so that the lower pads are protected by the sealant.

The sub-pixel driving array comprises a plurality of signal lines; and a plurality of sub-pixel drivers respectively formed in sub-pixels, each sub-pixel driver including at least two thin film transistors. Also, the sub-pixel driving array additionally comprises a first contact electrode to independently connect the plurality of sub-pixel drivers with the upper substrate; and a second contact electrode to connect one of the plurality of signal lines with the substrate. Each of the lower pads includes a first lower pad connected with at least one of the plurality of signal lines; and a second lower pad connected with the first lower pad, wherein the second lower pad is formed of the same metal material as those of the first and second contact electrodes, and is also formed on the same layer as the first and second electrodes.

Also, the OLED array includes a plurality of organic light-emitting diodes formed in the respective sub-pixels and connected with the respective sub-pixel drivers. At this time, one electrode is formed in each of the organic light-emitting diodes of the OLED array in common, and the one electrode is formed of the same transparent conductive layer as that of the upper pad.

Further, the OLED display device comprises a circuit film, on which a driving chip is mounted, connected with the upper pad.

In another aspect of the present invention, a method of fabricating an OLED display device comprises forming a sub-pixel driving array and a plurality of lower pads on a first substrate; forming an OLED array and a plurality of upper pads on a second substrate; and bonding the first and second substrates to each other by a sealant including a plurality of conductive balls, and respectively connecting the plurality of upper pads with the plurality of lower pads.

At this time, forming the sub-pixel driving array comprises respectively forming a plurality of signal lines and a plurality of sub-pixel drivers in the sub-pixels, wherein each sub-pixel driver includes at least two thin film transistors. Also, forming the sub-pixel driving array comprises forming a first contact electrode to independently connect the plurality of sub-pixel drivers with the upper substrate; and forming a second contact electrode to electrically connect one of the plurality of signal lines with the upper substrate. Also, forming the plurality of lower pads comprises forming a first lower pad together with the plurality of signal lines, wherein the first lower pad is electrically connected with at least one of the signal lines; and forming a second lower pad together with the first and second contact electrodes, wherein the second lower pad is electrically connected with the first lower pad.

Furthermore, forming the OLED array comprises respectively forming a plurality of organic light-emitting diodes in the sub-pixels of first substrate, wherein the organic light-emitting diodes are respectively connected with the sub-pixel drivers. Also, forming the plurality of upper pads comprises forming one electrode in each of the organic light-emitting diodes of the OLED array in common, wherein the one electrode is formed of a transparent conductive layer.

Also, the method additionally includes electrically connecting a circuit film, on which a driving chip is mounted, with the upper pad.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Prior to the explanation for an OLED display device according to the preferred embodiment of the present invention, there will be the explanation for an OLED display device from which the present invention is derived.

Figure 1:
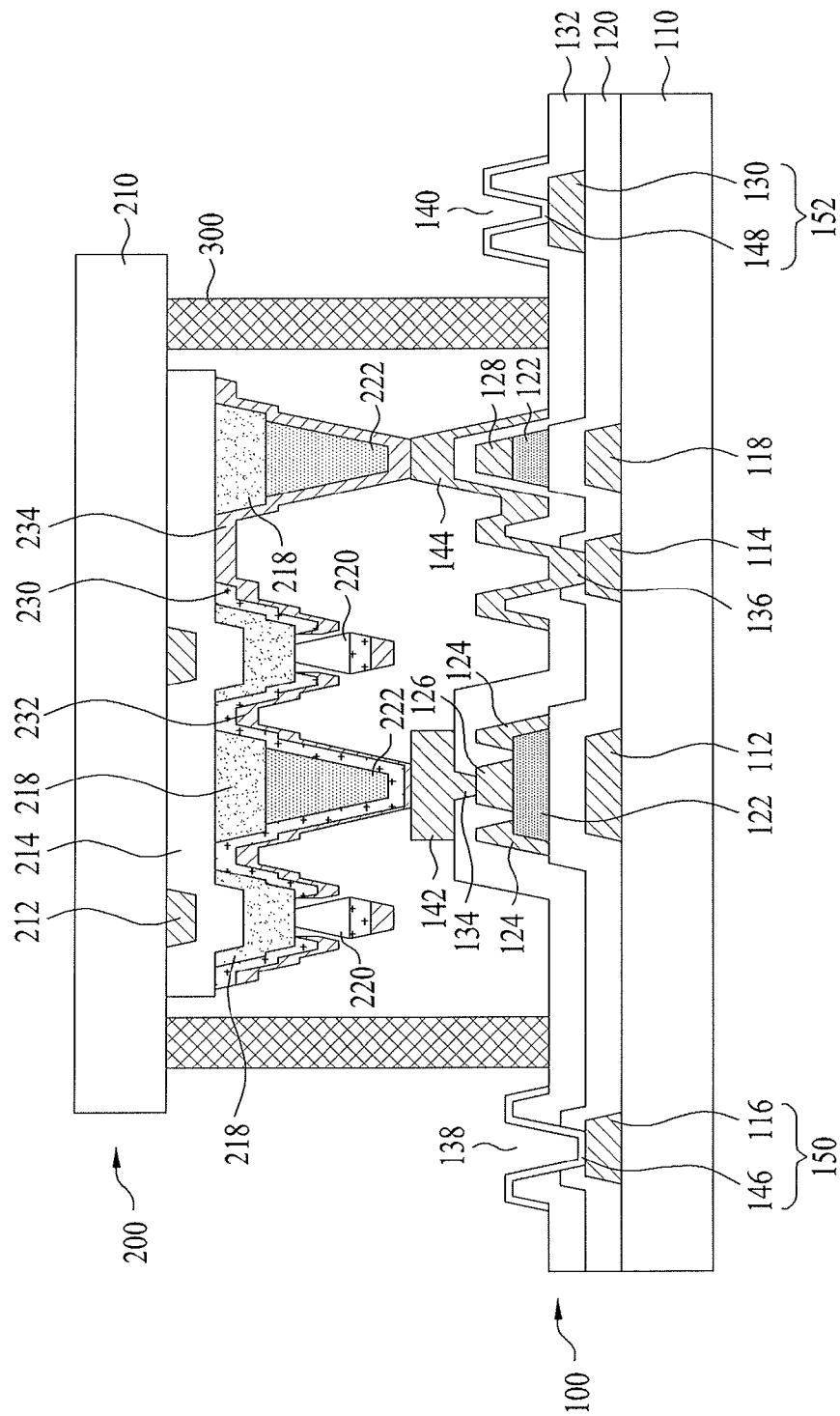
FIG. 1 is a cross section view illustrating an OLED display device of the related art.

FIG. 1 is a cross section view illustrating an OLED display device of the related art.

Referring to FIG. 1, the OLED display device is comprised of a lower substrate 100 including a sub-pixel driving array; an upper substrate 200 including an organic light-emitting diode (OLED) array; and a sealant 300 to bond the lower and upper substrate 100 and 200 to each other. In this case, the sub-pixel driving array includes a plurality of sub-pixel drivers to respectively drive a plurality of sub-pixels provided in an image displaying part, and the OLED array includes a plurality of OLEDs corresponding to the sub-pixels.

The lower substrate 100 is comprised of the sub-pixel driving array including a plurality of signal lines and thin film transistors TFTs, wherein the sub-pixel driving array is formed on an insulation substrate 110. In this case, the lower substrate 100 is divided into an inner area and an outer area by a sealing portion of sealant 300. The sub-pixel driving array is positioned in the inner area of the lower substrate 100.

The sub-pixel driver formed in each sub-pixel includes two thin film transistors and one capacitor. For example, one of the two thin film transistors correspond to the switching thin film transistor which supplies a data signal from a data line in response to a scan signal from a gate line; and the other corresponds to the driving thin film transistor which controls a current amount flowing through the OLED in response to the data signal from the switching thin film transistor. By the storage capacitor, the current amount flowing through the driving thin film transistor is made to be constant even though the switching thin film transistor is turned off. In this sub-pixel driver, the thin film transistor of FIG. 2 corresponds to the driving thin film transistor connected with the OLED, and the switching thin film transistor is identical in cross-sectional structure to the driving thin film transistor, whereby the drawing of switching thin film transistor is omitted.

The thin film transistor (TFT) shown in FIG. 1 includes a gate electrode 112 formed on the insulation substrate 110; a semiconductor layer 122 overlapping with the gate electrode 112 in state of interposing a gate insulation layer 120 therebetween; and source and drain electrodes 124 and 126 which use the semiconductor layer 122 as a channel. In addition, the thin film transistor (TFT) includes an impurity semiconductor layer, that is, an ohmic contact layer (not shown) formed between the semiconductor layer 122 and the source and drain electrodes 124 and 126.

The gate electrode 112 of driving thin film transistor is connected with a drain electrode (not shown) of switching thin film transistor, and the source electrode 124 of driving thin film transistor is connected with a second power-supplying line (not shown). Also, the drain electrode 126 is connected with the OLED, that is, a first electrode 232 of the OLED formed on the upper substrate 200, through a first contact electrode 142 and a conductive film 160. The gate electrode (not shown) of switching thin film transistor is connected with the gate line (not shown), and the source electrode of switching thin film transistor is connected with the data line (not shown).

The first contact electrode 142 is connected with the drain electrode 126 through a contact hole 134 formed in a passivation layer 132 to protect the thin film transistor (TFT). Also, the first contact electrode 142 is in contact with the first electrode 232 of OLED so that the first contact electrode 142 is electrically connected with the first electrode 232 of OLED formed on the upper substrate 200.

Furthermore, a first power-supplying line 114 is formed together with the gate electrode 112 in the circumference of sub-pixel driving array within the inner area of the lower substrate 100 sealed by the sealant 300. Also, a second contact electrode 144 is electrically connected with the first power-supplying line 114. The first power-supplying line 114 is electrically connected with a second electrode 214 of the OLED formed on the upper substrate 200 through the second contact electrode 144 formed on the lower substrate 100 and a third contact electrode 234 formed on the upper substrate 200.

The second contact electrode 144 is connected with the first power-supplying line 114 through the contact hole 136 formed in the passivation layer 132 and the gate insulation layer 120. Also, the second contact electrode 144 is electrically connected with the third contact electrode 234 formed on the upper substrate 200. In order to bring the second contact electrode 144 and the first contact electrode 142 into the same surface height, there are a plurality of dummy patterns 118, 122 and 128 below the second contact electrode 144. For example, the plurality of dummy patterns 118, 122 and 128 include the dummy pattern 118 formed together with the gate electrode 112; the semiconductor layer 122 formed on the gate insulation layer 120; and the dummy pattern 128 formed together with the source and drain electrodes 124 and 126 under the passivation layer 132. In addition, an impurity semiconductor layer (not shown) may be formed between the semiconductor layer 122 and the dummy pattern 128.

In the outer area of the sealing portion formed by the sealant 300 of the lower substrate 100, there is a pad region including a gate pad 150 connected with the gate line (not shown) and a data pad 152 connected with the data line (not shown). The gate pad 150 includes a lower gate pad 116 which is formed together with the gate electrode 112 and is extended from the gate line; and an upper gate pad 146 which is connected with the lower gate pad 116 through a contact hole 138 formed in the passivation layer 132 and the gate insulation layer 120. Also, the data pad 152 includes a lower data pad 130 which is formed together with the source and drain electrodes 124 and 126 and is extended from the data line; and an upper data pad 148 which is connected with the lower data pad 130 through a contact hole 140 formed in the passivation layer 132.

The upper substrate 200 includes the OLED array formed on an insulation substrate 210. The OLED array is comprised of a first electrode 232 connected with the sub-pixel driver of the lower substrate 100; a second electrode 214 connected with the second power-supplying line 114; and an organic light-emitting layer 230 formed between the first and second electrodes 232 and 214. The OLED array may be deteriorated due to moisture and gas. In this respect, the OLED array is formed in the inner area of the upper substrate 200 sealed by the sealant 300.

The second electrode 214 of OLED is formed on the insulation substrate 210, wherein the second electrode 214 is formed of a transparent conductive layer to transmit the light emitted from the organic light-emitting layer 230. The second electrode 214 is formed in shape of a plate including the entire OLED array. The second electrode 214 supplies the second power source provided through the second power-supplying line 114 to the OLED array in common. Then, an auxiliary electrode 212 is formed between the second electrode 214 and the insulation substrate 210, wherein the auxiliary electrode 212 of metal layer compensates for resistant elements of the transparent conductive layer. The auxiliary electrode 212 is formed in a non-emission area of the organic light-emitting layer 230.

Then, a buffer layer 218 is formed on the second electrode 214, to form a light-emission area of the organic light-emitting layer 230 by each sub-pixel. The buffer layer 218 is formed in the non-emission area of the organic light-emitting layer 230. The light-emission areas of organic light-emitting layer 230 provided by the buffer layer 218 are arranged by a matrix configuration. In other words, the buffer layer 218 provides the portion for the OLED in each sub-pixel.

After forming the buffer layer 218, a separator 220 and a contact spacer 222 are formed, wherein the separator 220 divides the organic light-emitting layer 230 and the first electrode 232 into sub-pixel units, and the contact spacer 222 is relatively higher so as to connect the first electrode 232 with the lower substrate 100. The separator 220 is formed in shape of a wall to surround each sub-pixel. The contact spacer 222 is formed in shape of a pillar at the predetermined portion to electrically connect the lower and upper substrates 100 and 200 to each other, for example, the contact portion between each sub-pixel driver and the OLED.

In order to separate the organic light-emitting layer 230 and the first electrode 232, the both side surface of the separator 220 are tapered in opposite to the contact spacer 222. That is, as the contact spacer 222 goes from its bottom being in contact with the buffer layer 218 to its end, the cross section area of contact spacer 222 is decreased gradually, whereby the contact spacer 222 has the forward slope. In the meantime, as the separator 220 goes from its bottom being in contact with the buffer layer 218 to its end, the cross section area of separator 220 is increased gradually, whereby the separator 220 has the reverse slope.

After that, the organic light-emitting layer 230 is formed on the second electrode 214 formed the buffer layer 218, the separator 220 and the contact spacer 222. Then, the first electrode 232 is formed on the organic light-emitting layer 230. In this case, the organic light-emitting layer 230 and the first electrode 232 are divided into the sub-pixel units by the reverse slope of separator 220. The organic light-emitting layer 230 includes a hole-injection layer, a hole-transport layer, a light-emitting layer, an electron-transport layer and an electron-injection layer. The organic light-emitting layer 230 emits red, green and blue lights by each sub-pixel unit.

The first electrode 232 on the contact spacer 222 has such a height as to allow the lower and upper substrates 100 and 200 to be in contact with each other when bonding the lower substrate 100 to the upper substrate 200. The contact spacer 222 is aligned to the first contact electrode 142 of lower substrate 100. Thus, the first electrode 232 covering the contact spacer 222 is electrically connected with the first contact electrode 142. As a result, the first electrode 232 of each OLED is supplied with the driving signal outputted from the thin film transistor (TFT) of each sub-pixel driver through the first contact electrode 142.

The second electrode 214 of upper substrate 200 is extended to the circumstance of OLED array, so that the second power source signal of lower substrate 100 is supplied to the second electrode 214 of upper substrate 200 through the third contact electrode 234. In order to make the third contact electrode 234, connected with the second electrode 214, being as high as the first electrode 232 when the third contact electrode 234 is in contact with the lower substrate 100, the buffer layer 218 and the contact spacer 222 are formed between the second electrode 214 and the third contact electrode 234. At this time, the buffer layer 218 and the contact spacer 222 are aligned to the second contact electrode 144 of lower substrate 100.

Accordingly, the third contact electrode 234 covering the buffer layer 218 and the contact spacer 222 is electrically connected with the second contact electrode 142 of lower substrate 100 when bonding the lower and upper substrates 100 and 200 to each other. As a result, the second electrode 214 is supplied with the second power source signal provided from the second power-supplying line 114 through the second contact electrode 142 and the third contact electrode 234. At this time, the third contact electrode 234 is formed together with the first electrode 232. Also, the third contact electrode 234 is separated from the first electrode 232 by the separator 220.

The first power-supplying line (not shown) of lower substrate 100 supplies the power source signal of any one of the driving voltage (VDD) and ground voltage (GND) to the source electrode 124 of the thin film transistor (TFT); and the second power-supplying line supplies the power source signal of the other to the source electrode 124. Accordingly, the first electrode 232 of OLED array formed on the upper substrate 200 is used as any one of the cathode and the anode; and the second electrode 214 is used as the other.

The sealant 300 is formed in the sealing portion of the lower or upper substrate 100 or 200. Then, the lower and upper substrates 100 and 200 are aligned and bonded to each other under the vacuum state. After that, ultraviolet rays are applied to the sealant 300, so that the sealant 300 is cured.

The upper gate pad 146 and the upper data pad 148 are formed on the outer area of the sealant 300 of the lower substrate 100, wherein the upper gate pad 146 and the upper data pad 148 are formed of transparent conductive layers of Indium Tin Oxide (ITO), so as to prevent the corrosion of upper gate pad and upper data pad. To electrically connect the first and second contact electrodes 142 and 144 with the first electrode 232 and the third contact electrode 234, the first and second contact electrodes 142 and 144 positioned in the inner area of sealant 300 are formed of metal materials. Since the first electrode 232 and the third contact electrode 234 generally include aluminum (Al) and the first and second contact electrodes 142 and 144 are formed of ITO, a nonconductor layer of $Al_2O_3$ is formed due to the chemical reaction between ITO and Al. In this respect, the contact electrodes 142 and 144 and the upper pads 146 and 148 which are the uppermost layers of lower substrate 100 are fabricated by the different mask processes. Thus, it is difficult to decrease the number of mask processes for the lower substrate 200.

In the OLED display device and the fabrication method thereof according to the present invention, the upper pad of transparent conductive layer is formed together with the second electrode of upper substrate, thereby decreasing the number of mask processes for the lower substrate. Hereinafter, OLED display devices according to the preferred embodiments of the present invention will be explained with reference to FIGS. 2 to 4.

Figure 2:
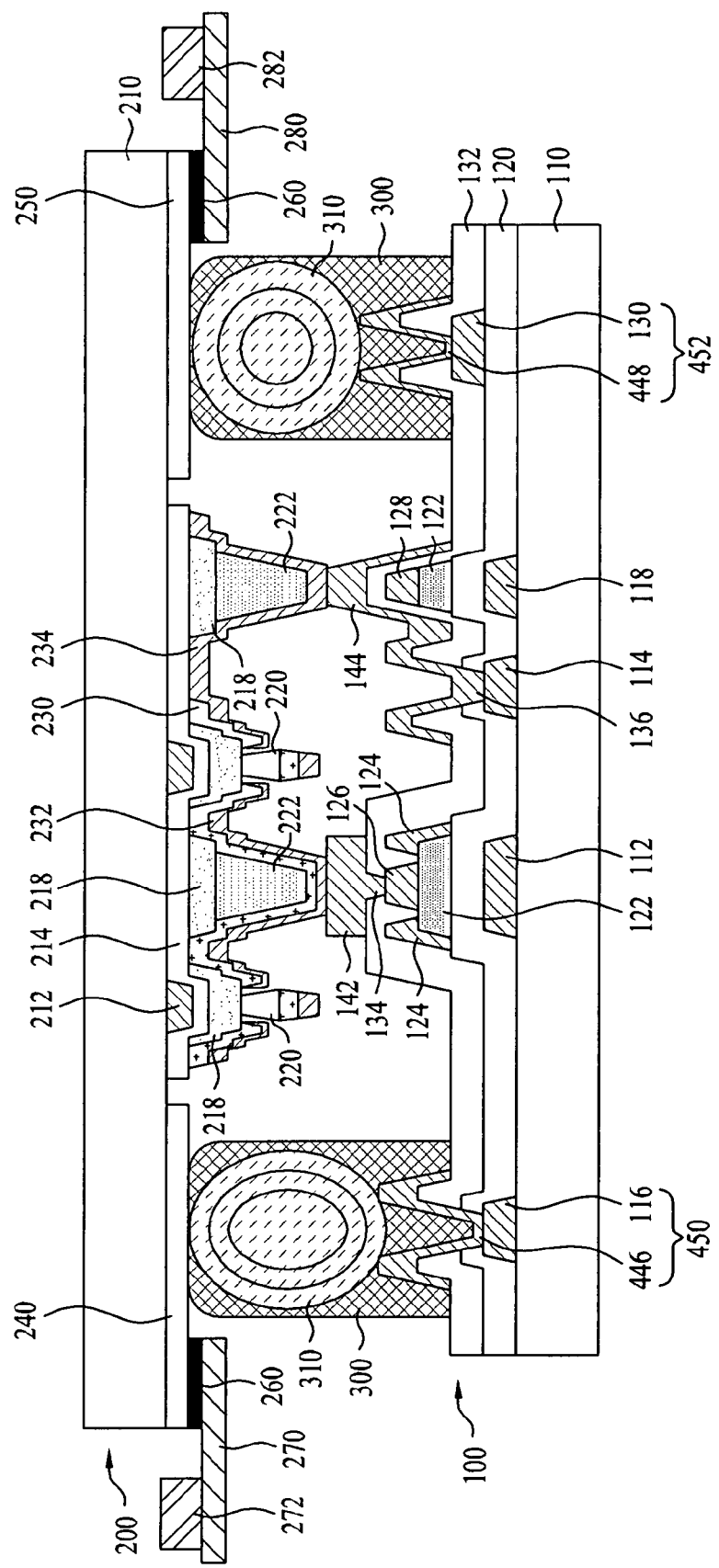
FIG. 2 is a cross section view illustrating an OLED display device according to an embodiment.

FIG. 2 is a cross section view illustrating an OLED display device according to an embodiment.

The OLED display device shown in FIG. 2 is identical in structure to the OLED display device of FIG. 1 except that upper pads 240 and 250 are formed on upper substrate 200 and the upper pads 240 and 250 are electrically connected with lower pads 450 and 452 of lower substrate 100 through conductive balls 310 included in a sealant 300, respectively. Thus, elements shown in FIG. 1 will be described in brief, or will be omitted.

The OLED display device of FIG. 2 is comprised of the lower substrate 100 including a sub-pixel driving array and lower pads 450 and 452 formed on an insulation substrate 110; the upper substrate 200 including an OLED array and upper pads 240 and 250 formed on an insulation substrate 210; and a sealant 300 to bond the lower and upper substrates 100 and 200 to each other. At this time, the lower pads 450 and 452 are respectively connected with the upper pads 240 and 250 by the conductive balls 310 included in the sealant 300.

The sub-pixel driving array including a thin film transistor (TFT) is formed in the inner area of lower substrate 100 sealed by the sealant 300. Also, the OLED array is formed in the inner area of upper substrate 200 sealed by the sealant 300. The OLED array includes a plurality of OLEDs, wherein each OLED is comprised of first and second electrodes 232 and 214, and an organic light-emitting layer 230 formed between the first and second electrodes 232 and 214. The second electrode 214 is formed in the respective OLEDs of the OLED array in common. Also, the organic light-emitting layer 230 and the first electrode 232 are divided into sub-pixel units by a separator 220. The first electrode 232 is supported by a buffer layer 218 and a contact spacer 222 so that the first electrode 232 is electrically connected with a first contact electrode 142 of lower substrate 100. Also, a third contact electrode 234 connected with the second electrode 214 is supported by the buffer layer 218 and the contact spacer 222 so that the third contact electrode 234 is electrically connected with the second contact electrode 144 of lower substrate 100. Then, the thin film transistor (TFT) of lower substrate 100 is electrically connected with the first electrode 232 of upper substrate 200 through the first contact electrode 142. Also, a second power-supplying line 114 is electrically connected with the second electrode 214 of upper substrate 200 through the second and third contact electrodes 144 and 234. Accordingly, the organic light-emitting layer 230 responds to a data signal supplied from the thin film transistor (TFT) of sub-pixel driver, whereby the organic light-emitting layer 230 emits the light based on a current amount flowing through the first and second electrodes 232 and 214. Then, the light emitted from the organic light-emitting layer 230 proceeds upwardly through the second electrode 214 and the insulation substrate 210.

There are the lower gate pad 450 and the lower data pad 452 in the circumference of lower substrate 100, wherein the lower gate pad 450 is in contact with a gate line (not shown), and the lower data pad 452 is contact with a data line (not shown). The lower gate pad 450 includes a first lower gate pad 116 which is formed together with a gate electrode 122 and is extended from the gate line; and a second lower gate pad 446 which is connected with the first lower gate pad 116 through a contact hole 138 formed in the passivation layer 132 and gate insulation layer 120. The lower data pad 452 is comprised of a first lower data pad 130 which is formed together with source and drain electrodes 124 and 126 and is extended from the data line; and a second lower data pad 448 which is electrically connected with the first lower data pad 130 through a contact hole 140 formed in the passivation layer 132. The second lower gate pad 446 and the second lower data pad 448 are formed together with the first and second contact electrodes 142 and 144. The sealant 300 overlaps with the pad region including the lower gate pad 450 and the lower data pad 452. Accordingly, even though the second lower gate pad 446 and the second lower data pad 448 are formed of the same metal material as those of the first and second contact electrodes 142 and 144, it is possible to prevent the second lower gate pad 446 and the second lower data pad 448 from being corroded.

Figure 3:
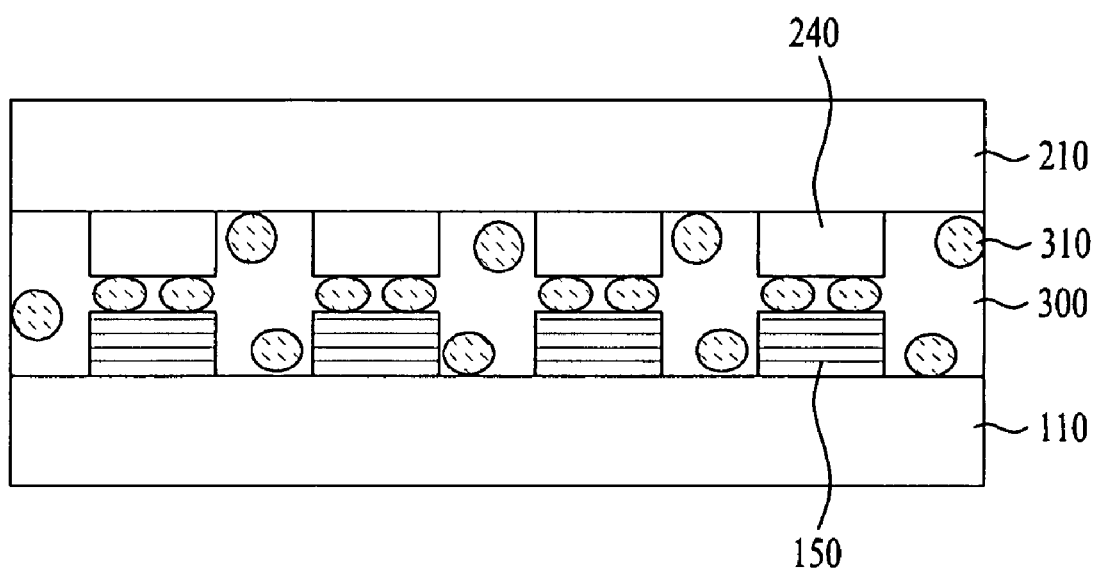
FIG. 3 is a cross section view illustrating a pad contact structure of lower and upper substrates shown in FIG. 2.

In the circumference of upper substrate 200, there are the upper gate pad 240 and the upper data pad 250. The upper gate pad 240 is electrically connected with the lower gate pad 450 of lower substrate 100 through the conductive ball 310, and the upper data pad 250 is electrically connected with the lower data pad 452 of lower substrate 100 through the conductive ball 310. The upper gate pad 240, the upper data pad 250 and the second electrode 214 are formed of transparent conductive layers, and the upper gate pad 240 and the upper data pad 250 overlaps with the sealant 300. The sealant 300 includes the conductive balls 310 to electrically connect the upper pads 240 and 250 with the lower pads 450 and 452 respectively. For example, as shown in FIG. 3, the lower gate pad 150 formed on the lower substrate 110 is electrically connected with the upper gate pad 240 formed on the upper substrate 210 through anisotropic conducting balls included in the sealant 300. The conductive balls 310 are formed of the same anisotropic conducting balls having the elastic properties as an anisotropic conducting film (ACF). Thus, the lower and upper pads are electrically connected to each other without regard to the step difference of lower and upper substrates 100 and 200.

A circuit film 270, on which a gate driving chip 272 is mounted, is adhered to the upper gate pad 240 through the ACF 260 so that the circuit film 270 is electrically connected with the upper gate pad 240. Also, another circuit film 280, on which a data driving chip 282 is mounted, is adhered to the upper data pad 250 through the ACF 260 so that the circuit film 280 is electrically connected with the upper data pad 250. The circuit films 270 and 280 on which the driving chips 272 and 282 are mounted may be formed of Tape Carrier Package TCP or Chip On Film COF.

For the OLED display device according to the present invention, the upper pads 240 and 250 of transparent conductive layers are formed together with the second electrode 214 of upper substrate 200, thereby decreasing the processing steps for the lower substrate 100.

Figure 4:
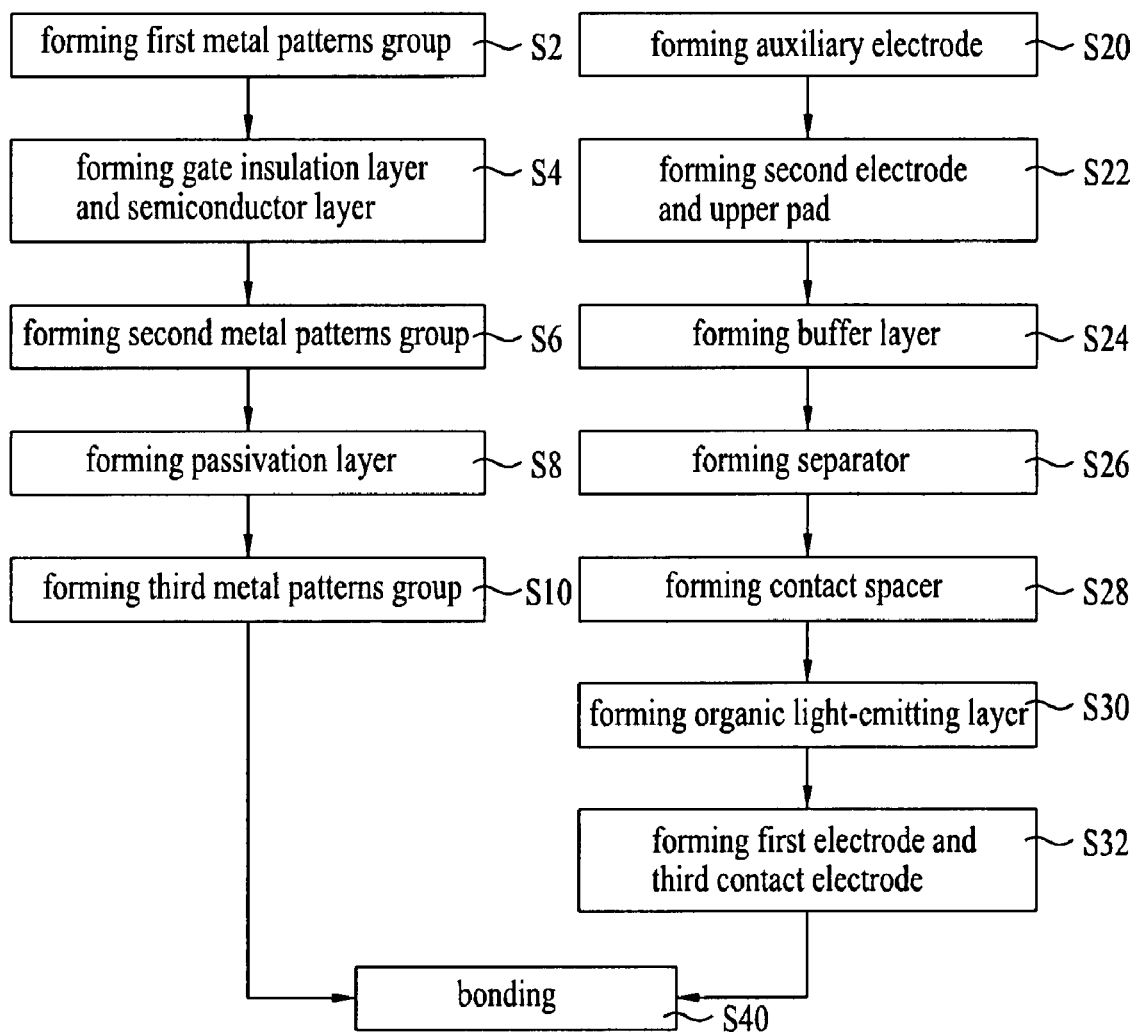
FIG. 4 is a flowchart illustrating a method of fabricating an OLED display device according to an embodiment.

FIG. 4 is a flowchart illustrating a method of fabricating an OLED display device according to an embodiment, which refers to the OLED display device of FIG. 2.

In the step 2 (S2), a first metal patterns group is formed on the insulation substrate 110 of lower substrate 100, wherein the first metal patterns group includes the gate line (not shown), the gate electrode 112, the second power-supplying line 114, the dummy pattern 118 and the first lower gate pad 116. In detail, a first metal layer is deposited on the insulation substrate 110 by sputtering, and is then patterned by photolithography and etching, thereby forming the first metal patterns group. The first metal layer is formed of molybdenum (Mo), titanium (Ti), copper (Cu), aluminum (Al), chrome (Cr) or alloy thereof, wherein the first metal layer may be formed in a single-layered structure or multi-layered structure.

In the step 4 (S4), the gate insulation layer 120 is formed on the insulation substrate 110 formed the first metal patterns group. Thereon, a semiconductor layer 122 and an impurity semiconductor layer (not shown) are deposited in sequence. In detail, the gate insulation layer 120, the semiconductor layer 122 and the impurity semiconductor layer are deposited by PECVD (Plasma Enhanced Chemical Vapor Deposition). The gate insulation layer 120 is formed of an inorganic insulation material of silicon nitride ($SiN_x$) or silicon oxide ($SiO_x$). The semiconductor layer 122 is formed of an amorphous silicon layer (a-Si), and the impurity semiconductor layer is formed of a silicon layer doped with $n^+$ ions. Then, the impurity semiconductor layer and the semiconductor layer 122 are patterned by photolithography and etching, whereby the semiconductor layer 122 and the impurity semiconductor layer are partially left on the gate insulation layer 120.

In the step 6 (S6), a second metal patterns group is formed on the gate insulation layer 120 formed the semiconductor layer 122, wherein the second metal patterns group includes the data line (not shown), the first power-supplying line (not shown), the source electrode 124, the drain electrode 126, the dummy pattern 128 and the lower data pad 130. In detail, a second metal layer is deposited on the gate insulation layer 120 formed the semiconductor layer 122 by sputtering, and is then patterned by photolithography and etching, thereby forming the second metal patterns group. Then, the exposed portion of impurity semiconductor layer is removed by the etching process using the source and drain electrodes 124 and 126 as a mask. The second metal layer is formed of molybdenum (Mo), titanium (Ti), copper (Cu), aluminum (Al), chrome (Cr) or alloy thereof, wherein the second metal layer may be formed in a single-layered structure or multi-layered structure. In the meantime, the semiconductor layer 122, the impurity semiconductor layer and the second metal patterns group may be formed by one mask process using a diffraction exposure mask of diffraction exposure or a half-tone mask of semi-transmittance.

In the step 8 (S8), the passivation layer 132 including the plurality of contact holes 134, 136, 138 and 140 is formed on the gate insulation layer 120 formed the second metal patterns group. The passivation layer 132 may be formed on the gate insulation layer 120 formed the second metal patterns group by CVD. Then, the passivation layer 132 is patterned by photolithography and etching, thereby forming the contact hole 134 to expose the predetermined portion of drain electrode 126, the contact hole 136 to expose the predetermined portion of second power-supplying line 114 through the gate insulation layer 120, the contact hole 138 to expose the first lower gate pad 116, and the contact hole 140 to expose the lower data pad 130. The passivation layer 132 is formed of the inorganic insulation material of silicon nitride ($SiN_x$) or silicon oxide ($SiO_x$). On the other hand, the passivation layer 132 may be formed of an organic insulation material by a spin coating method or a spinless coating method.

In the step 10 (S10), a third metal patterns group is formed on the passivation layer 132, wherein the third metal patterns group includes the first and second contact electrodes 142 and 144, the second lower gate pad 446 and the second lower data pad 448. In detail, a third metal layer is deposited on the passivation layer 132, and is then patterned by photolithography and etching, thereby forming the third metal patterns group. The first contact electrode 142 is electrically connected with the drain electrode 126 of thin film transistor (TFT) through the contact hole 134, and the second contact electrode 144 is electrically connected with the second power-supplying line 114 through the contact hole 136. The second lower gate pad 446 is connected with the first lower gate pad 116 through the contact hole 138, and the second lower data pad 448 is electrically connected with the lower data pad 130 through the contact hole 140. The third metal layer is formed of molybdenum (Mo), titanium (Ti), copper (Cu), aluminum (Al), chrome (Cr) or alloy thereof, wherein the first metal layer may be formed in a single-layered structure or Multi-layered structure.

Through the above-mentioned steps 2 to 10 (S2 to S10), the lower substrate 100 of FIG. 1 is completed.

In the step 20 (S20), an auxiliary electrode 212 is formed on the insulation substrate 210 of upper substrate 200. To form the auxiliary electrode 212, a metal layer is deposited on the insulation substrate 210 by sputtering, and is then patterned by photolithography and etching. The metal layer for the auxiliary electrode 212 is used of molybdenum (Mo), titanium (Ti), copper (Cu), aluminum (Al), chrome (Cr) or alloy thereof, wherein the auxiliary electrode 212 may be formed in a single-layered structure or multi-layered structure.

Figure 5:
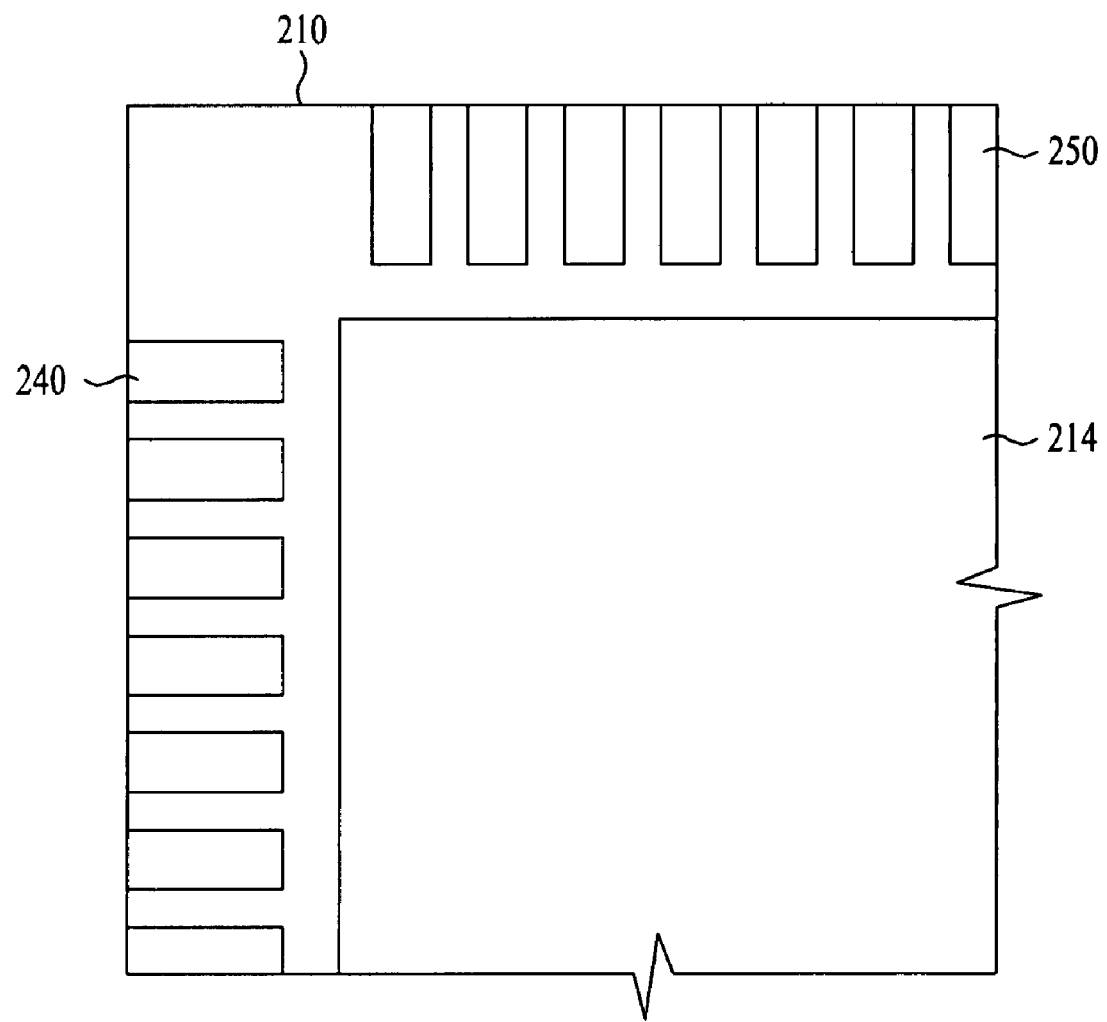
FIG. 5 is a plane view illustrating an upper pad and a second electrode shown in FIG. 2.

In the step 22 (S22), the second electrode 214 and upper pads 240 and 250 are formed on the insulation substrate 210 formed the auxiliary electrode 212. To form the second electrode 214 and upper pads 240 and 250, a transparent conductive layer is deposited on the insulation substrate 210 formed the auxiliary electrode 212 by sputtering, and is then patterned by photolithography and etching. As shown in FIG. 5, the second electrode 214 is formed in the OLED array region of insulation substrate 210; the upper gate pad 240 is formed in the gate pad region; and the upper data pad 259 is formed in the data pad region. The transparent conductive layer may be used of ITO (Indium Tin Oxide), TO (Tin Oxide), IZO (Indium Zinc Oxide) or ITZO (Indium Tin Zinc Oxide).

In the step 24 (S24), the buffer layer 218 is formed on the second electrode 214. To form the buffer layer 218, an insulation layer is deposited on the second electrode 214 by PECVD, and is then patterned by photolithography and etching. The buffer layer 218 may be formed of the inorganic insulation material of silicon nitride ($SiN_x$) or silicon oxide ($SiO_x$). On the other hand, the buffer layer 218 may be formed of an organic insulation material by a spin coating method or a spinless coating method.

In the step 26 (S26), the separator 220 is formed on the buffer layer 218. To form the separator 220, an organic insulation material is coated on the buffer layer 218 by a spin coating method or a spinless coating method, and is then patterned by photolithography and etching, whereby the separator 220 has the reverse slope.

In the step 28 (S28), the contact spacer 222 is formed on the buffer layer 218. To form the contact spacer 222, an organic insulation material is coated on the buffer layer 218 by a spin coating method or a spinless coating method, and is then patterned by photolithography and etching. In the meantime, the contact spacer 222 may be formed on the buffer layer 218 before forming the separator 220.

In the step 30 (S30), the organic light-emitting layer 230 is formed on the second electrode 214 formed the contact spacer 222, the separator 220 and the buffer layer 218. The organic light-emitting layer 230 is sequentially formed in the corresponding portions of red, green and blue by the repeated deposition process using a shadow mask. The organic light-emitting layer 230 is divided into the sub-pixel units by the separator 220.

In the step 32 (S32), the first electrode 232 is formed on the organic light-emitting layer 230, and the third contact electrode 234 is formed on the first electrode 232. To form the first electrode 232 and the third contact electrode 234, a metal material is deposited on the organic light-emitting layer 230 by a thermal evaporation. The first electrode 232 is divided into the sub-pixel units by the separator 220. Also, the third contact electrode 234 is separated from the first electrode 232 by the separator 220. The first electrode 232 and the third contact electrode 234 may be formed of at least one of Al, MgAg, Ca or Ba.

Through the steps 20 to 32 (S20 to S32), the upper substrate 200 of FIG. 1 is completed.

In the step 40 (S40), the sealant 300 including the conductive balls 310 is formed on the lower substrate 100, and the upper substrate 200 is positioned in opposite to the lower substrate 100. Then, the lower and upper substrates 100 and 200 are bonded to each other under the vacuum state. By the pressure applied to the upper substrate 200, the portion for the contact spacer 222 of upper substrate 200 is brought into contact with the lower substrate 100. Accordingly, the second electrode 232 formed on the contact spacer 222 is electrically connected with the first contact electrode 142 of lower substrate, and the third contact electrode 234 formed on the contact spacer 222 is electrically connected with the second contact electrode1 144. According as the sealant 300 overlaps with the lower pads 450 and 452 of lower substrate 100 and the upper pads 240 and 250 of upper substrate 200, the lower pads 450 and 452 are electrically connected with the upper pads 240 and 250 through the conductive balls 310.

Thereafter, the ACF 250 is coated on the upper pads 240 and 250 of upper substrate 200. Then, the circuit film 270 on which the gate driving chip 272 is mounted and the circuit film 280 on which the data driving chip 282 is mounted are aligned and adhered to the ACF 260 by thermal compression.

In the method of fabricating the OLED display device according to the present invention, the upper pads 240 and 250 of transparent conductive layers are formed together with the second electrode 214 of upper substrate 200, so that it is possible to decrease the processing steps for the lower substrate 100.

As mentioned above, the OLED display device and the fabricating method thereof according to the present invention have the following advantages.

In the OLED display and the fabricating method thereof according to the present invention, the upper pad of transparent conductive layer is formed together with the transparent electrode of upper substrate. Also, the upper pad is electrically connected with the lower pad through the conductive balls included in the sealant. Accordingly, there is no requirement for the mask process to form the transparent conductive layer of lower substrate, whereby the number of mask processes is decreased, thereby decreasing the fabrication cost for the OLED display device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An OLED display device comprising:
    a sub-pixel driving array disposed on a first substrate;
    an OLED array disposed on a second substrate;
    a sealant to bond the first and second substrates to each other;
    a plurality of lower pads disposed on the first substrate;
    a plurality of upper pads disposed on the second substrate; and
    a plurality of conductive balls included in the sealant, wherein the upper pads are respectively connected with the lower pads through the conductive balls,
    wherein the OLED array includes a plurality of organic light-emitting diodes respectively disposed in sub-pixels,
    wherein each of the plurality of organic light-emitting diodes comprise:
    a transparent electrode on the second substrate;
    an organic light-emitting layer on the transparent; and
    a first electrode on the organic light-emitting layer connected with the sub-pixel driving array,
    wherein the upper pad is formed of the same transparent conductive layer and in the same layer as the transparent electrode at the same mask process,
        wherein the upper pads are extended from an inner area of the sealant of the second substrate to an outer area of the sealant of the second substrate which is outside the sealant, a circuit film is connected with the upper pads in the outer area of the sealant of the second substrate so that the circuit film does not overlap the sealant, and a driving chip is disposed on the circuit film; and wherein each of the lower pads include a first pad and a second pad, which is connected with the first pad through a contact hole, and is connected with each of the upper pads through the conductive balls.

2. The OLED display device of claim 1, wherein the plurality of conductive balls are formed of anisotropic conducting balls.

3. The OLED display device of claim 1, wherein the sealant overlaps with the plurality of upper pads and lower pads.

4. The OLED display device of claim 3, wherein the plurality of lower pads are substantially completely covered by the sealant.

5. The OLED display device of claim 4, wherein the sub-pixel driving array comprises:
a plurality of signal lines; and
a plurality of sub-pixel drivers respectively disposed in the sub-pixels, each sub-pixel driver including at least two thin film transistors and connected with the respective organic light-emitting diodes.

6. The OLED display device of claim 5, wherein the sub-pixel driving array further comprises:
a first contact electrode to independently connect the plurality of sub-pixel drivers with the upper substrate; and
a second contact electrode to connect one of the plurality of signal lines with the substrate.

7. The OLED display device of claim 6, wherein each of the lower pads includes:
a first lower pad connected with at least one of the plurality of signal lines; and
a second lower pad connected with the first lower pad, wherein the second lower pad is formed of the same metal material as those of the first and second contact electrodes, and is also disposed on the same layer as the first and second electrodes.

8. The OLED display device of claim 6, wherein the transparent electrode is disposed in the organic light-emitting diodes of the OLED array in common.

9. A method of fabricating an OLED display device comprising:
forming a sub-pixel driving array and a plurality of lower pads on a first substrate;
forming an OLED array and a plurality of upper pads on a second substrate; and
bonding the first and second substrates to each other by a sealant including a plurality of conductive balls, and respectively connecting the plurality of upper pads with the plurality of lower pads,
wherein forming the OLED array includes respectively forming a plurality of organic light-emitting diodes in the sub-pixels of first substrate,
wherein forming each of the plurality of organic light-emitting diodes comprise:
forming a transparent electrode on the second substrate;
forming an organic light-emitting layer on the transparent; and
forming a first electrode on the organic light-emitting layer connected with the sub-pixel driving array,
wherein the upper pad is formed of the same transparent conductive layer and in the same layer as the transparent electrode at the same mask process,
wherein the upper pads are extended from an inner area of the sealant of the second substrate to an outer area of the sealant of the second substrate which is outside the sealant, a circuit film is connected with the upper pads in the outer area of the sealant of the second substrate so that the circuit film does not overlap the sealant, and a driving chip is disposed on the circuit film; and wherein each of the lower pads include a first pad and a second pad, which is connected with the first pad through a contact hole, and is connected with each of the upper pads through the conductive balls.

10. The method of claim 9, wherein the plurality of conductive balls are formed of anisotropic conducting balls.

11. The method of claim 9, wherein the sealant overlaps with the plurality of lower and upper pads.

12. The method of claim 11, wherein the plurality of lower pads are substantially completely covered by the sealant.

13. The method of claim 12, wherein forming the sub-pixel driving array comprises:
respectively forming a plurality of signal lines and a plurality of sub-pixel drivers in the sub-pixels, wherein each sub-pixel driver includes at least two thin film transistors and connected with the respective organic light-emitting diodes.

14. The method of claim 12, wherein forming the sub-pixel driving array comprises:
forming a first contact electrode to independently connect the plurality of sub-pixel drivers with the upper substrate; and
forming a second contact electrode to electrically connect one of the plurality of signal lines with the upper substrate.

15. The method of claim 14, wherein forming the plurality of lower pads comprises:
forming a first lower pad together with the plurality of signal lines, wherein the first lower pad is electrically connected with at least one of the signal lines; and
forming a second lower pad together with the first and second contact electrodes, wherein the second lower pad is electrically connected with the first lower pad.

16. The method of claim 9, wherein the transparent electrode is formed in the organic light-emitting diodes of the OLED array in common.

* * * * *